(12) United States Patent
McLaughlin et al.

(10) Patent No.: US 6,842,873 B1
(45) Date of Patent: Jan. 11, 2005

(54) ADVANCED FORWARD ERROR CORRECTION

(75) Inventors: Steven W. McLaughlin, Decatur, GA (US); Andrew Thangaraj, Atlanta, GA (US)

(73) Assignee: LSI Logic Corporation, Milpitas, CA (US)

( * ) Notice: Subject to any disclaimer, the term of this patent is extended or adjusted under 35 U.S.C. 154(b) by 558 days.

(21) Appl. No.: 10/057,774

(22) Filed: Jan. 22, 2002

Related U.S. Application Data

(60) Provisional application No. 60/304,717, filed on Jul. 10, 2001.

(51) Int. Cl.[7] ............................................. H03M 13/00
(52) U.S. Cl. ...................................... 714/709; 714/752
(58) Field of Search ................................ 714/709, 704, 714/705, 712, 746, 758, 752, 795

(56) References Cited

U.S. PATENT DOCUMENTS 6,735,725 B1 * 5/2004 Wu et al. .................... 714/704

2003/0051206 A1 * 3/2003 Kondo ........................ 714/795
2003/0101409 A1 * 5/2003 Levy et al. .................. 714/789

OTHER PUBLICATIONS

Gallager, R. G., "Low–Density Parity–Check Codes", IRE Transactions on Information Theory, p. 21, 1962.

Y. Kou, S. Lin, M. Fossorier, "Low Density Parity Check Codes Based on Finite Geometries: A Rediscovery and More", IEEE Transactions on Information Theory, vol. 47, Issue 7, Nov. 2001, pp. 2711–2736.

* cited by examiner

Primary Examiner—Christine T. Tu

(57) ABSTRACT

A computer program product, apparatus, and method for correcting errors introduced into a set of data bits during transmission of the set of data bits over a channel includes determining a confidence measure for each data bit based only on the values of one or more of the data bits, each confidence measure representing the probability that the value of the corresponding data bit is correct; and changing the value of a given data bit when the confidence measure for the given data bit indicates that the value of the given data bit is not correct, thereby producing a corrected data bit.

80 Claims, 11 Drawing Sheets

ADVANCED FORWARD ERROR CORRECTION

CROSS REFERENCE TO RELATED APPLICATIONS

This application claims priority to U.S. Provisional Patent Application No. 60/304,717 entitled ADVANCED FORWARD ERROR CORRECTION AND ITERATIVE SOFT DECODING, filed Jul. 10, 2001, which is incorporated herein by reference for all purposes.

This invention was made with United States Government support by the U.S. Department of Commerce through the NSIC/MORE program under cooperative agreement number 70NANB7H3054. The United States Government has certain rights in this invention.

BACKGROUND

The present invention relates generally to the correction of errors introduced into data during transmission, and particularly to techniques for forward error correction of such errors.

Fiber optics provide an ideal communications medium. They yield very large potential data rates with relatively few impairments in the medium to disrupt communications when compared to systems like wireless communication or data storage. One of the limiting factors in fiber optic communication is cost. Because of the high data rates on most fiber links, the electronic circuits that are used to generate, process and receive the data can be very expensive. This has forced fiber optic networks to proliferate in the core of the data network, where cost is less of a concern because the network core aggregates a great deal of data and the cost can be spread across many users. One of the key technology enablers in core fiber optic networks is forward error control (FEC) technology. The primary purpose of FEC is to correct errors that occur during transmission. FEC is the process of inserting additional bits into data before transmission to facilitate correction of bit errors introduced during transmission. In core networks where the data rate is high (for example, 10 gigabits per second), FEC can be very expensive.

FEC can be used to improve the reliability of a link by many orders of magnitude. For example, the raw bit error rate (BER) of a link having a BER of 1 in 1000 bits can be improved to 1 bit in 1,000,000,000,000 with the addition of approximately 7% FEC bits. This improvement in BER allows a service provider many options. For example the length of the fiber can be increased, or the transmitted optical power can be reduced.

Recently a new class of FEC codes has been introduced that achieve coding efficiencies that approach the theoretical limit predicted by theory. These codes, referred to as "turbo codes," generally have three characteristics. First, they employ long codeword block lengths. Second, they employ some form of diversity, meaning that each codeword symbol is generated based upon multiple data bits. Finally, turbo codes are iteratively decodable. Due to their extremely high coding efficiencies, turbo codes are well-suited for error-prone communications channels such as satellite links, wireless links, and long-haul electronic links.

Another key feature of conventional turbo codes is that decoding requires a measurement of the received energy level for each codeword symbol. For example, commercially-available analog-to-digital converters (ADCs) connected to low-speed channels can be used to provide a numerical measurement of the received energy level, which is used by the turbo decoder. However, ADCs that operate at the high speeds required by fiber-optic channels have yet to be developed. For this reason, turbo codes have yet to be applied to fiber-optic channels.

SUMMARY

In general, in one aspect, the invention features a computer program product, apparatus, and method for correcting errors introduced into a set of data bits during transmission of the set of data bits over a channel. It includes determining a confidence measure for each data bit based only on the values of one or more of the data bits, each confidence measure representing the probability that the value of the corresponding data bit is correct; and changing the value of a given data bit when the confidence measure for the given data bit indicates that the value of the given data bit is not correct, thereby producing a corrected data bit.

Particular implementations can include one or more of the following features. Implementations include determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

Determining a confidence measure for each data bit includes generating a plurality of check bits based on the data bits such that each of the check bits is a predetermined function of one or more of the data bits; and determining the confidence measures based on the values of the check bits. Generating includes taking the logical exclusive-or of a predetermined subset of the data bits, thereby producing a predetermined one of the check bits. Determining a second confidence measure for each corrected data bit includes generating a plurality of second check bits based on the corrected data bits such that each of the second check bits is a predetermined function of one or more bits of the corrected data; and determining the second confidence measures based on the values of the second check bits and the confidence measures.

Implementations include determining a composite confidence measure based on the confidence measures; and executing the changing step only when the composite confidence measure falls below a predetermined composite confidence threshold. The data bits are encoded before transmission over the channel using a majority-logic-decodable code. The channel is a fiber-optic channel. The channel is an optical storage medium. The optical storage device medium is a digital video disc (DVD). The optical storage device medium is a compact disc (CD).

In general, in one aspect, the invention features a computer program product, apparatus, and method for correcting errors introduced into a set of data bits during transmission of the set of data bits over a channel. It includes determining a confidence measure for each data bit based on the received energy level of that data bit, each confidence measure representing the probability that the value of the corresponding data bit has a predetermined value; selecting a value for each data bit based on the corresponding confidence measure, thereby producing corrected data bits; determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

Particular implementations can include one or more of the following features. Determining a confidence measure for each data bit includes generating a plurality of check bits based on the data bits such that each of the check bits is a predetermined function of one or more of the data bits; and determining the confidence measures based on the values of the check bits. Generating includes taking the logical exclusive-or of a predetermined subset of the data bits, thereby producing a predetermined one of the check bits. Determining a second confidence measure for each corrected data bit includes generating a plurality of second check bits based on the corrected data bits such that each of the second check bits is a predetermined function of one or more bits of the corrected data; and determining the second confidence measures based on the values of the second check bits and the confidence measures.

Implementations include determining a composite confidence measure based on the confidence measures; and executing the changing step only when the composite confidence measure falls below a predetermined composite confidence threshold.

The data bits are encoded before transmission over the channel using a majority-logic-decodable code. The channel is a fiber-optic channel. The channel is an optical storage medium. The optical storage device medium is a digital video disc (DVD). The optical storage device medium is a compact disc (CD).

Advantages that can be seen in implementations of the invention include one or more of the following. Unlike conventional turbo decoders, no knowledge of the received energy level of each bit is required; therefore implementations are ideal for high-speed fiber optic networks, where such knowledge is unavailable. The error-correction capacity of conventional codes is increased by using iterative decoding techniques. For some codes this is as much as twice the usual error correction capability of the code. Implementations are easy to understand and implement since the decoding usually involves counting and flipping bits rather than more abstract computations common in FEC codes like Reed Solomon or Bose, Ray-Chauduri, Hocquenghem (BCH) codes.

The details of one or more embodiments of the invention are set forth in the accompanying drawings and the description below. Other features, objects, and advantages of the invention will be apparent from the description and drawings, and from the claims.

Figure 1:
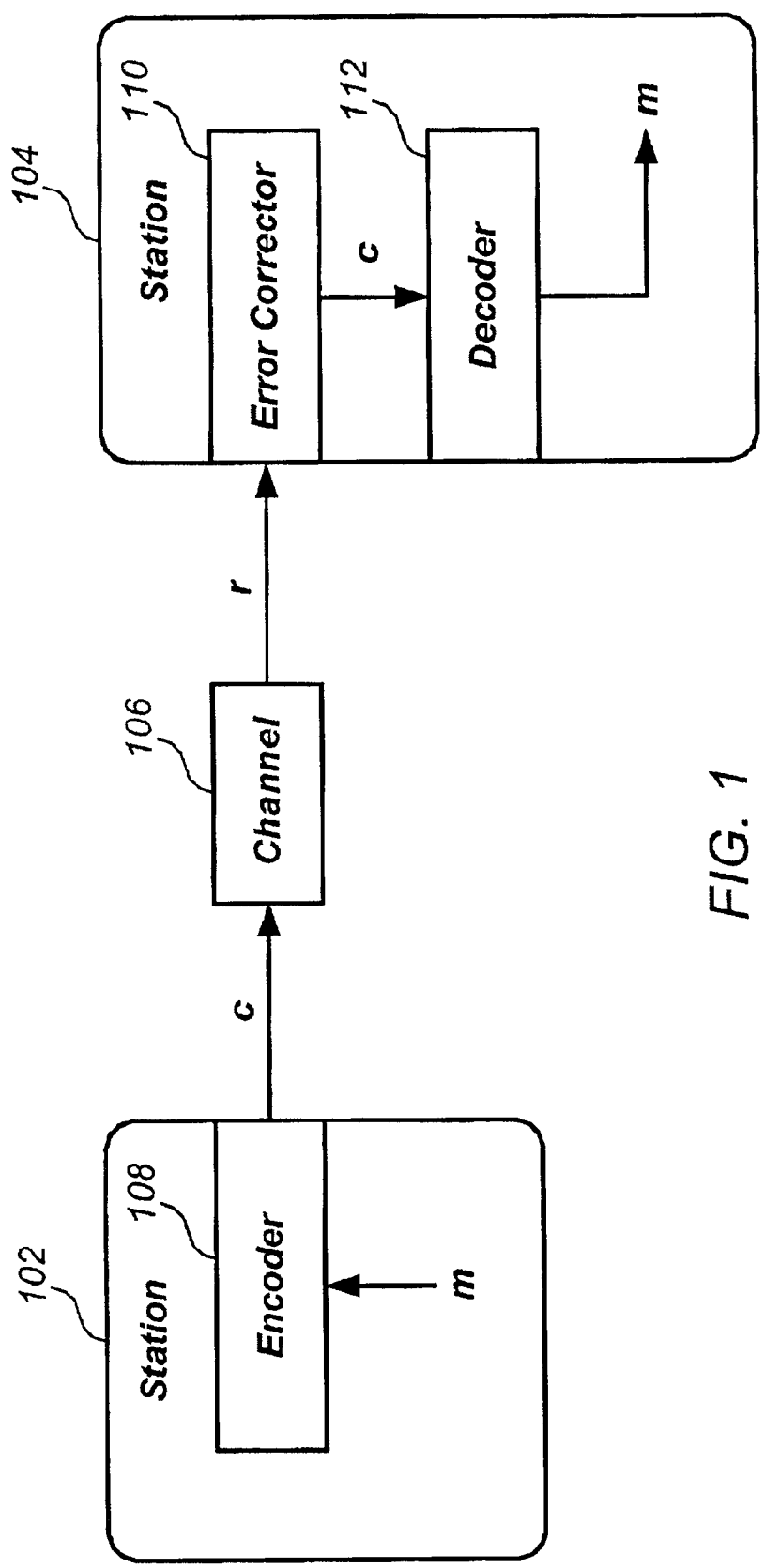
FIG. 1 shows a station that sends data to another station over a channel.

The leading digit(s) of each reference numeral used in this specification indicates the number of the drawing in which the reference numeral first appears.

DETAILED DESCRIPTION

Referring to FIG. 1, a station 102 sends data to a station 104 over a channel 106. A message vector m at station 102 is encoded by an encoder 108 to produce a codeword vector c that is transmitted over channel 106. Noise present on channel 106 introduces errors into codeword vector c to produce a result vector r that is received at station 104. An error corrector 110 performs error correction upon result vector r to recover codeword vector c. A decoder 112 decodes codeword vector c to reconstruct message vector m. Channel 106 can be a fiber-optic link, an optical storage device such as a digital video disc (DVD) or a compact disc (CD), a wireline link, a wireless link, and the like.

Message vector m having k bits is encoded by multiplying message vector m by a n×k generator matrix G to produce a codeword vector c having n bits. The overhead O of the code defined by generator matrix G is given by $$O = \frac{n-k}{k} \qquad (1)$$

One popular code, provided by the International Telecommunication Union (ITU) Recommendation G.975 entitled "Forward Error Correction for Submarine Systems," has an overhead of 7%.

For G.975 the length of the message vector m is 239 bytes. For simplicity, we first discuss a code having 25% overhead and k=4 so that n=5. The message vector m can be represented by $$m=[m_1\ m_2\ m_3\ m_4] \qquad (2)$$

The codeword vector c can be represented by $$c=[c_1\ c_2\ c_3\ c_4\ c_5]=m \times G \qquad (3)$$

An example generator matrix G is given by $$G = \begin{bmatrix} 1 & 0 & 1 & 0 & 1 \\ 0 & 1 & 1 & 1 & 1 \\ 1 & 1 & 0 & 1 & 0 \\ 1 & 0 & 0 & 0 & 1 \end{bmatrix} \qquad (4)$$

Each column of generator matrix G corresponds to one bit of codeword vector C. Thus the bits of the message vector m upon which a symbol of the corresponding codeword vector c depend are selected by the ones in the column of G corresponding to that codeword symbol. For example, column one of G has ones in the first, third and fourth rows; therefore codeword symbol $c_1$ depends upon the first, third and fourth bits of message vector m. In particular, codeword symbol $c_1$ is produced by the exclusive-or of those bits.

$$c_1 = m_2 \otimes m_2 \otimes m_3 \qquad (5)$$

Note that this code has diversity because each column of G has multiple ones; therefore each codeword symbol produced by G depends upon multiple bits of message vector m.

Figure 2:
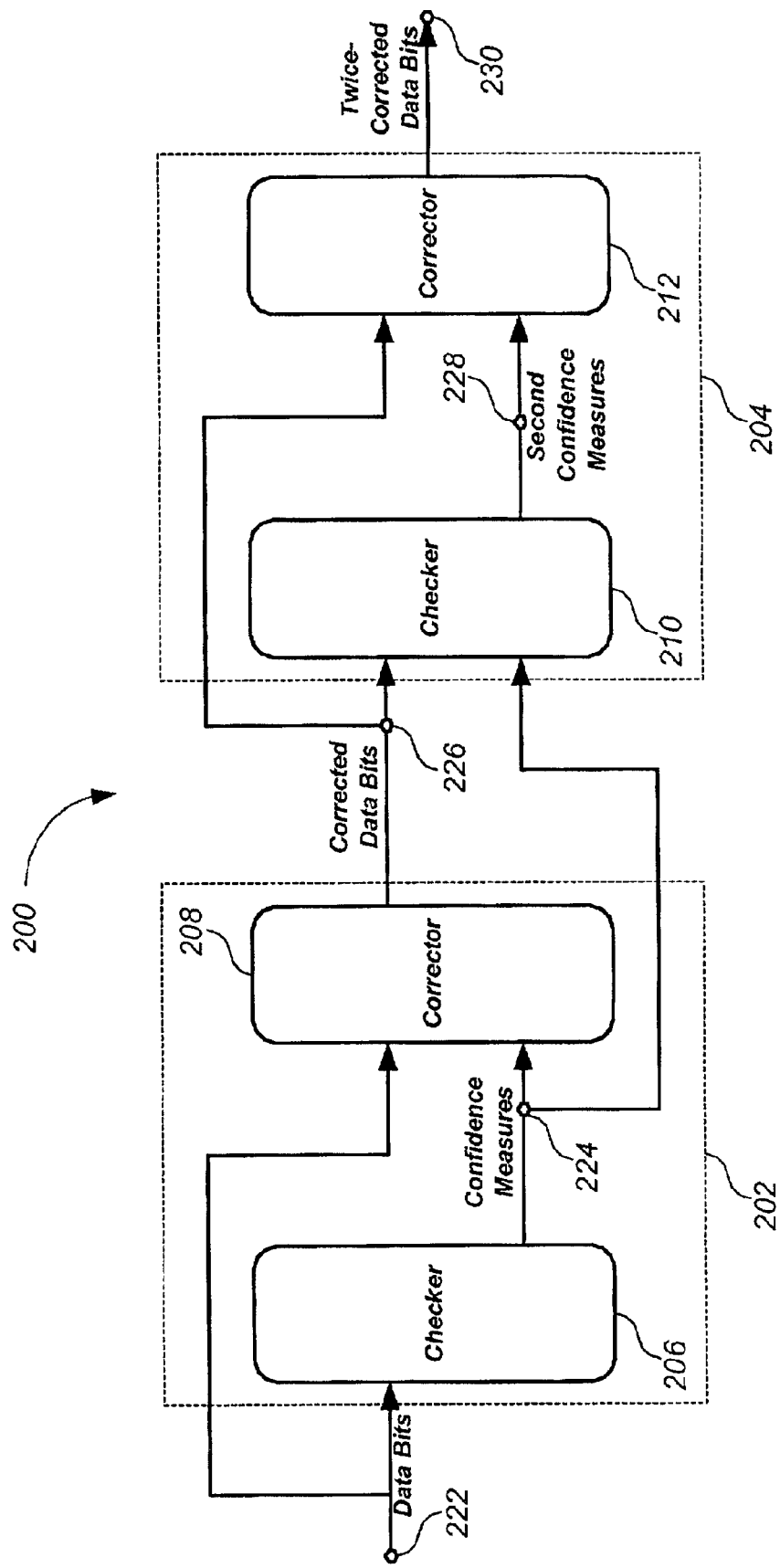
FIG. 2 shows an error corrector according to one implementation.
Figure 3:
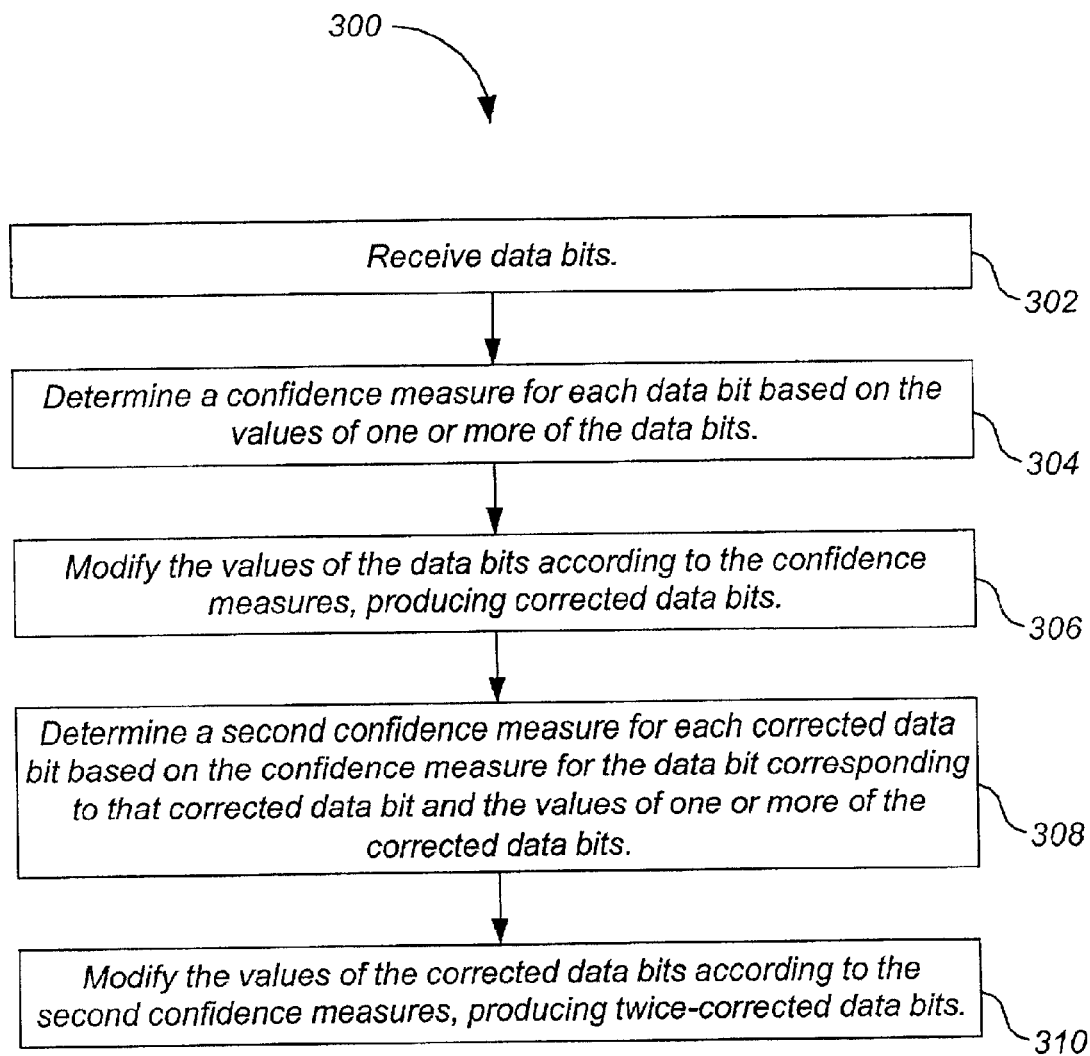
FIG. 3 shows an operation of the error corrector of FIG. 2 according to one implementation.

FIG. 2 shows an error corrector 200 according to one implementation. Error corrector 200 can be used to implement error corrector 110 shown in FIG. 1. Error corrector 200 includes a first stage 202 and a second stage 204. Implementations including additional error stages will be apparent to one skilled in the relevant arts after reading this description. FIG. 3 shows an operation of error corrector 200 according to one implementation.

First stage 202 includes a checker 206 and a corrector 208. Checker 206 receives data bits, for example, the symbols of result vector r, at 222 (step 302). Checker 206 determines a confidence measure for each data bit based on the values of one or more of the data bits (step 304), and presents the confidence measures at 224. Each confidence measure represents the level of confidence that the value of the corresponding data bit is correct. For example, where confidence measures are determined as a value within a range of values, a high confidence measure value indicates that the value of the corresponding data bit is correct, while a low confidence measure value indicates that the value of the corresponding data bit is incorrect. Checker 206 requires no external confidence measure, such as a measure of the received energy level for each data bit, but rather generates confidence measures internally, based on the values of the received data bits.

Corrector 208 receives the data bits and the confidence measures determined by checker 206 and modifies the values of the data bits according to the confidence measures to produce corrected data bits at 226 (step 306). In particular, corrector 208 changes the value of a data bit when the confidence measure for that data bit indicates that the value of that data bit is not correct. For example, the confidence measure, which can take on a range of numerical values, can indicate that the value of a data bit is not correct when the confidence measure falls below a predetermined threshold value.

Second stage 204 includes a checker 210 and a corrector 212. Checker 210 receives the corrected data bits and determines a second confidence measure for each corrected data bit. The second confidence measure for a corrected data bit is based on (1) the confidence measure determined by checker 206 for the data bit corresponding to that corrected data bit and (2) the values of one or more of the corrected data bits (step 308), as described in detail below. The second confidence measures are presented at 228. Each second confidence measure represents the probability that the value of the corresponding corrected data bit is correct.

Corrector 212 receives the corrected data bits and the confidence measures determined by checker 210 and modifies the values of the corrected data bits according to the confidence measures to produce twice-corrected data bits at 230 (step 310). In particular, corrector 212 changes the value of a corrected data bit when the second confidence measure for that corrected data bit indicates that the value of that corrected data bit is not correct.

Figure 4:
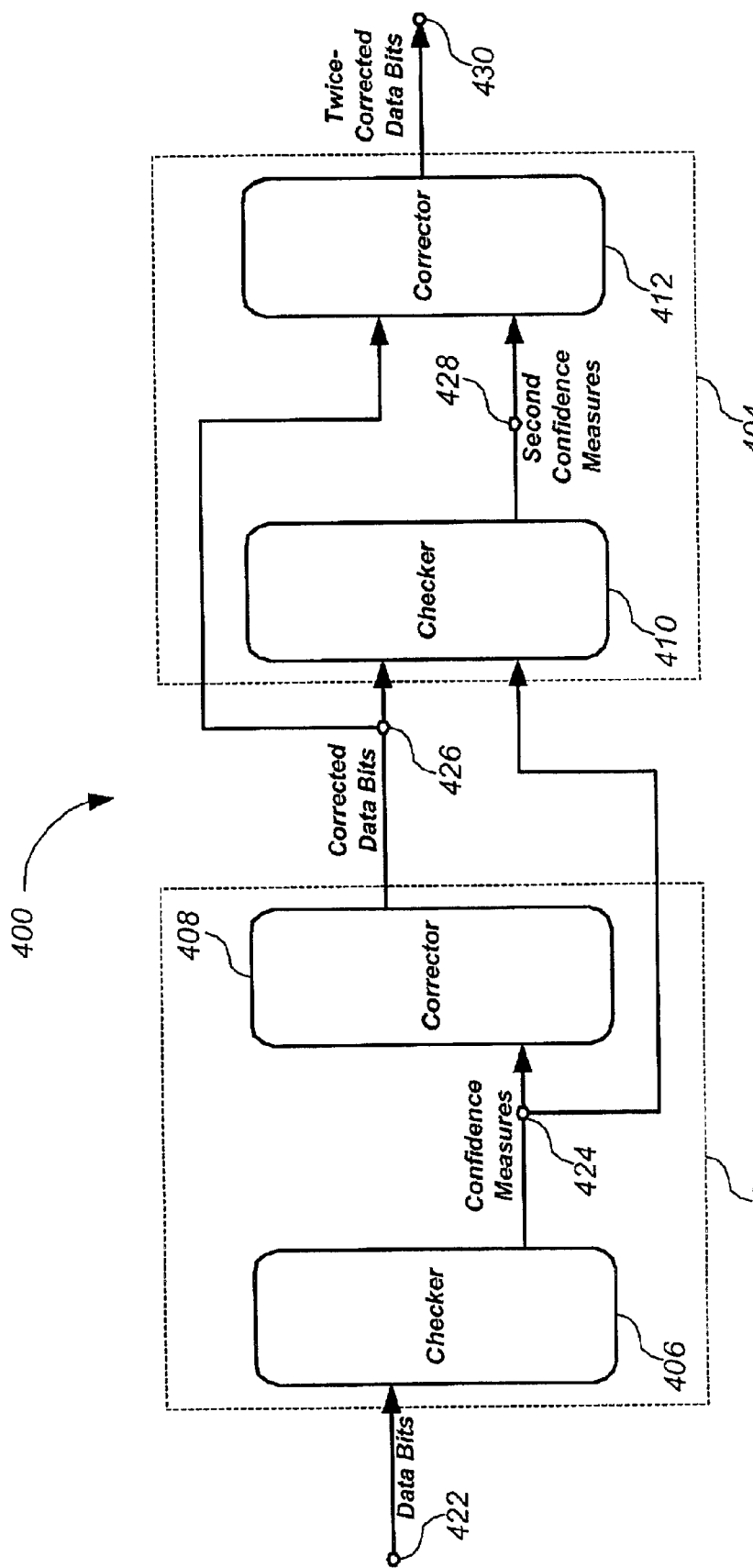
FIG. 4 shows an error corrector according to another implementation.

FIG. 4 shows an error corrector 400 according to another implementation. Error corrector 400 can be used to implement error corrector 110 shown in FIG. 1. Error corrector 400 includes a first stage 402 and a second stage 404. Implementations including additional error stages will be apparent to one skilled in the relevant arts after reading this description.

Figure 5:
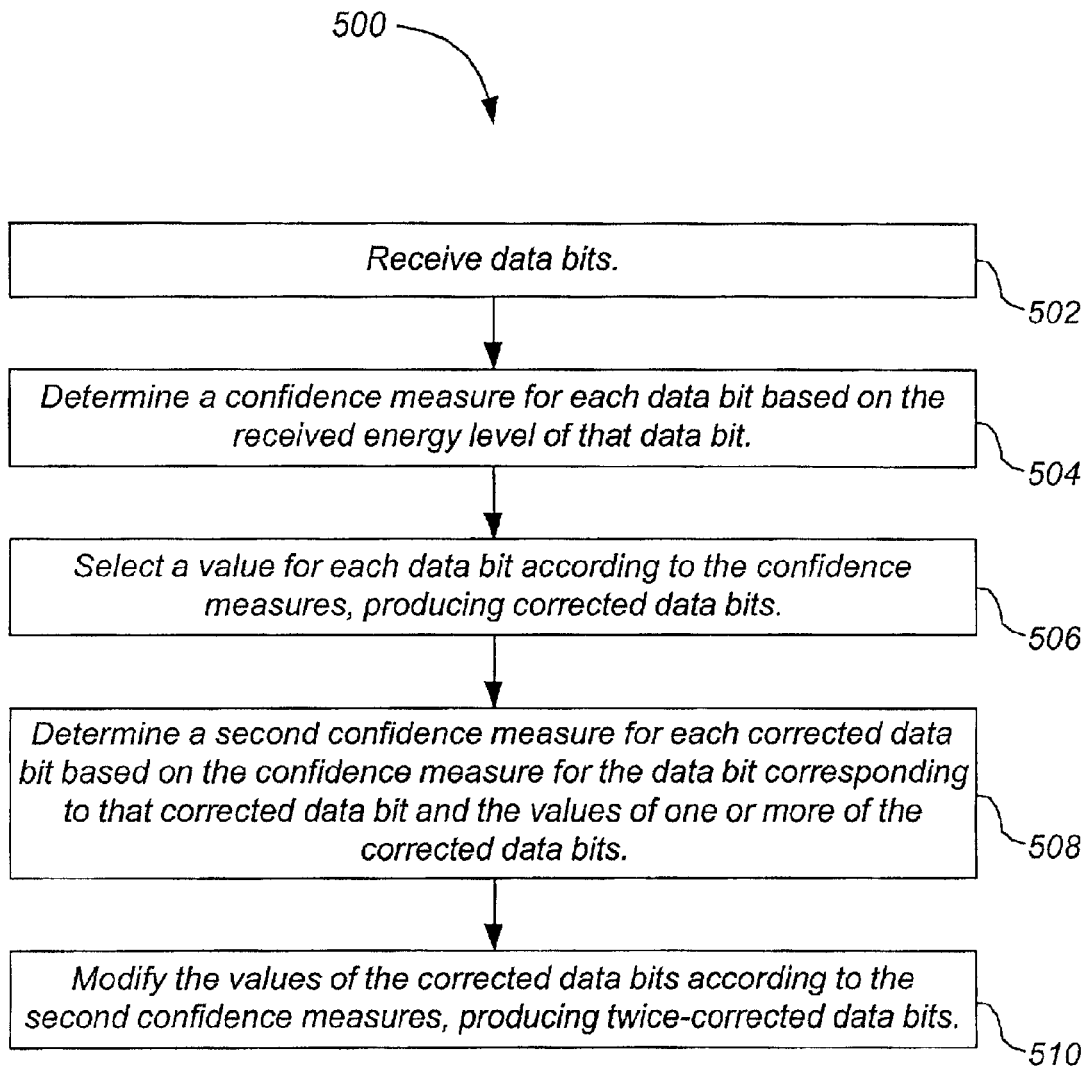
FIG. 5 shows an operation of the error corrector of FIG. 4 according to one implementation.

FIG. 5 shows an operation of error corrector 400 according to one implementation.

First stage 402 includes a checker 406 and a corrector 408. Checker 406 receives data bits, for example, the symbols of result vector r, at 422 (step 502). More precisely, checker 406 receives energy levels, each corresponding to a data bit. Checker 406 determines a confidence measure for each data bit based on the received energy level of the data bit (step 504), and presents the confidence measures at 424. For example, checker 406 includes an analog-to-digital converter (ADC) that generates a numerical value for each energy level. Each confidence measure represents the probability that the value of the corresponding data bit has a predetermined value. For example, a high confidence measure value indicates that the value of the corresponding data bit is a logical one, while a low confidence measure value indicates that the value of the corresponding data bit is a logical zero.

Corrector 408 receives the data bits and the confidence measures determined by checker 406 and selects the values of the data bits according to the confidence measures to produce corrected data bits at 426 (step 506). For example, corrector 408 selects a logical one as the value of a data bit when the confidence measure for that data bit is high, and selects a logical zero as the value of a data bit when the confidence measure for that data bit is low.

Second stage 404 includes a checker 410 and a corrector 412. Checker 410 receives the corrected data bits and determines a second confidence measure for each corrected data bit. The second confidence measure for a corrected data bit is based on (1) the confidence measure determined by checker 406 for the data bit corresponding to that corrected data bit and (2) the values of one or more of the corrected data bits (step 508), as described in detail below. The second confidence measures are presented at 428. Each second confidence measure represents the probability that the value of the corresponding corrected data bit is correct.

Corrector 412 receives the corrected data bits and the second confidence measures determined by checker 410 and modifies the values of the corrected data bits according to the second confidence measures to produce twice-corrected data bits at 430 (step 510). In particular, corrector 412 changes the value of a corrected data bit when the second confidence measure for that corrected data bit indicates that the value of that corrected data bit is not correct.

Figure 6:
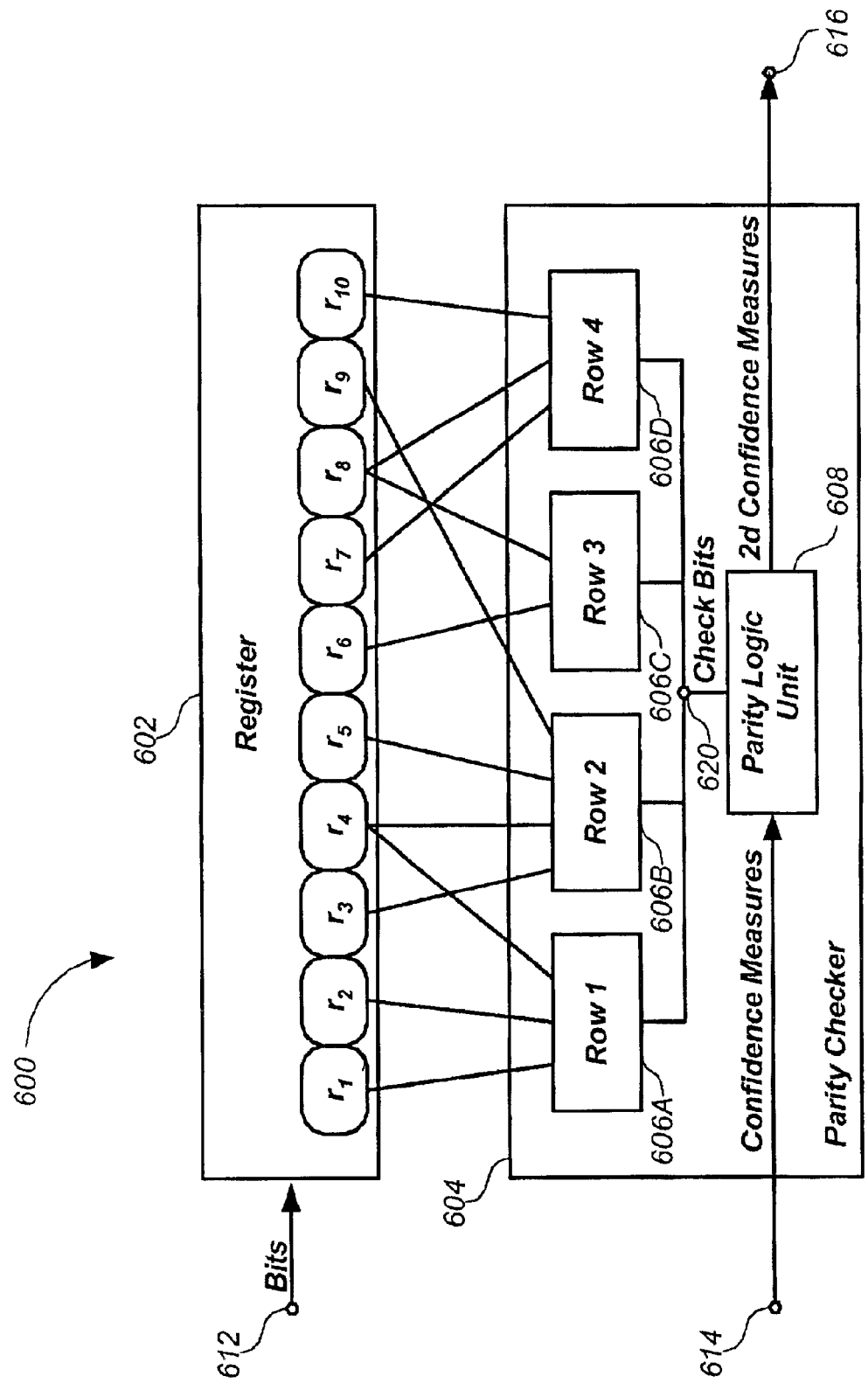
FIG. 6 shows a checker according to one implementation.

FIG. 6 shows a checker 600 according to one implementation. Checker 600 can be used to implement checkers 206 and 210 shown in FIG. 2 and checker 410 shown in FIG. 4. Referring to FIG. 6, a register 602 receives bits to be checked at 612. The register 602 shown in FIG. 6 is designed for a code having n=10; therefore register 602 holds 10 bits $r_1$ through $r_{10}$. A parity checker 604 examines the bits in register 602. Parity checker 604 is designed for a code having k=6; therefore parity checker 604 has n-k=4 bit checkers 606. Each bit checker 606 examines one or more of the bits in register 602, and produces a check bit at 620 that is a function of the examined bits. For example, a check bit could be the exclusive-or of the bits examined. Referring to FIG. 6, the check bit k produced by bit checker 606A is given by $$k = r_1 \otimes r_2 \otimes r_3 \qquad (6)$$

In one implementation, the correspondence between bits in register 602 and parity checkers 606 can be represented by a parity check matrix H having n columns and n-k rows. In many instances (for example, when the code is systematic) parity check matrix H can be derived from generator matrix G according to well-known techniques. The parity check matrix H for checker 600 is given by $$H = \begin{bmatrix} 1 & 1 & 0 & 1 & 0 & 0 & 0 & 0 & 0 & 0 \\ 0 & 0 & 1 & 1 & 1 & 0 & 0 & 0 & 1 & 0 \\ 0 & 0 & 0 & 0 & 0 & 1 & 0 & 1 & 0 & 0 \\ 0 & 0 & 0 & 0 & 0 & 0 & 1 & 1 & 0 & 1 \end{bmatrix} \quad (7)$$

Each bit checker 606 corresponds to one of the rows of H. Each bit checker examines a bit when the corresponding row of H has a one in the column corresponding to that bit. For example, row one of H has ones in the first, second and fourth columns; therefore, the corresponding bit checker 606A examines the first, second and fourth bits $r_1$, $r_2$ and $r_4$.

A parity logic unit 608 examines the check bits. In one implementation, parity logic unit 608 compares each check bit to a predetermined value. For example, a check bit value of 1 indicates that an odd number of the bits examined are in error, while a check bit value of 0 indicates that an even number of the bits examined are in error, or that none of the bits examined are in error. The predetermined value can be different for each bit checker 606.

Parity logic unit 608 implements a set of rules to determine a confidence measure for each of the bits. Such rules are well-known in the relevant arts. In one implementation, the rules make the determination based only on the values of the check bits. For example, the confidence measure for a data bit can be the number of check bits that are based on the selected data bit and that have predetermined values that indicate that the data bit is correct. In another implementation, the rules make the determination based on the values of the check bits and confidence measures received at 614. The confidence measures can be generated by measuring the received energy level of each bit, or by another checker 600. Based on the determination, parity logic unit 608 generates second confidence measures at 616.

The bits can be corrected iteratively, as described above, to obtain codeword vector c. When the correction process is complete, decoder 112 decodes the codeword according to conventional methods to obtain the originally-sent message m. If the code used by encoder 108 is systematic, then the codeword vector c=[m p] contains message m. The message vector for non-systematic codes is also easily retrieved according to well-known techniques.

The inventors have found that a class of codes known as majority logic (ML) decodable codes are especially useful with certain implementations. It should be clear that we did not find the class of codes, and we were not the first to use them in an iterative configurations. Instead we were the first the use them in an optical recording setting with the optimized thresholds. When the code used is an ML code, the operation implemented by checker 600 in determining check bits k is simply $$K = rH^T \quad (8)$$

where r is the vector of bits and $H^T$ is the transpose of matrix H.

A code that is ML decodable has a parity check matrix H that has certain properties.

Recall that H is an (n-k)-by-n matrix, where the j'th row of H corresponds to the j'th parity check and the ones in the i'th column indicate which parity checks the i'th bit is involved in. An important property of a majority-logic decodable code is the following: Let $S_i$ be the set of parity checks that codeword bit $c_i$ is involved in. Furthermore let $C_i$ be the set of size $M_i$ of all code bits that are involved in the parity checks in $S_i$. Clearly $c_i$ is one of bits involved in parity checks in $S_i$, and in fact, $c_i$ is involved in every parity check in $S_i$. We say that a code is (one-step) majority logic decodable if all other code bits $c_j, j \neq i$, in $C_i$, are involved in exactly one parity check in $S_i$ for all i.

Assume that the checker is trying to identify whether received bit $r_i$ is correct or not. If $r_i$ is the only bit that is in error then all of the parity checks connected to it (that is those parity checks in $S_i$) will be 1 (that is, not satisfied). If $r_i$ is in error this is a clear indication that $r_i$ must be flipped (that is, the value of $r_i$ must be changed). Next assume that two errors have occurred, say in positions i and k. If $c_k$ is in $C_i$, then exactly one of the parity checks in $S_i$ are satisfied (that is, 0), and all of the others parity checks in $S_i$ are unsatisfied (that is, 1), again indicating that $r_i$ is in error. If $c_k$ is not in $C_i$, then all of the parity checks in $S_i$ and $S_k$ will be unsatisfied (that is, 1), again indicating that $r_i$ and $r_k$ are in error.

If fewer than $M_i/2$ errors occur to bits in $C_i$ then, following the previous reasoning, fewer than $M_i/2$ parity checks in $S_i$ will be satisfied, giving us an indication that $r_i$ is more likely to be in error than not. If in fact $r_i$ is in error, this logic can be used to correct $r_i$ as long as there are fewer than $M_i/2$ errors.

Figure 7:
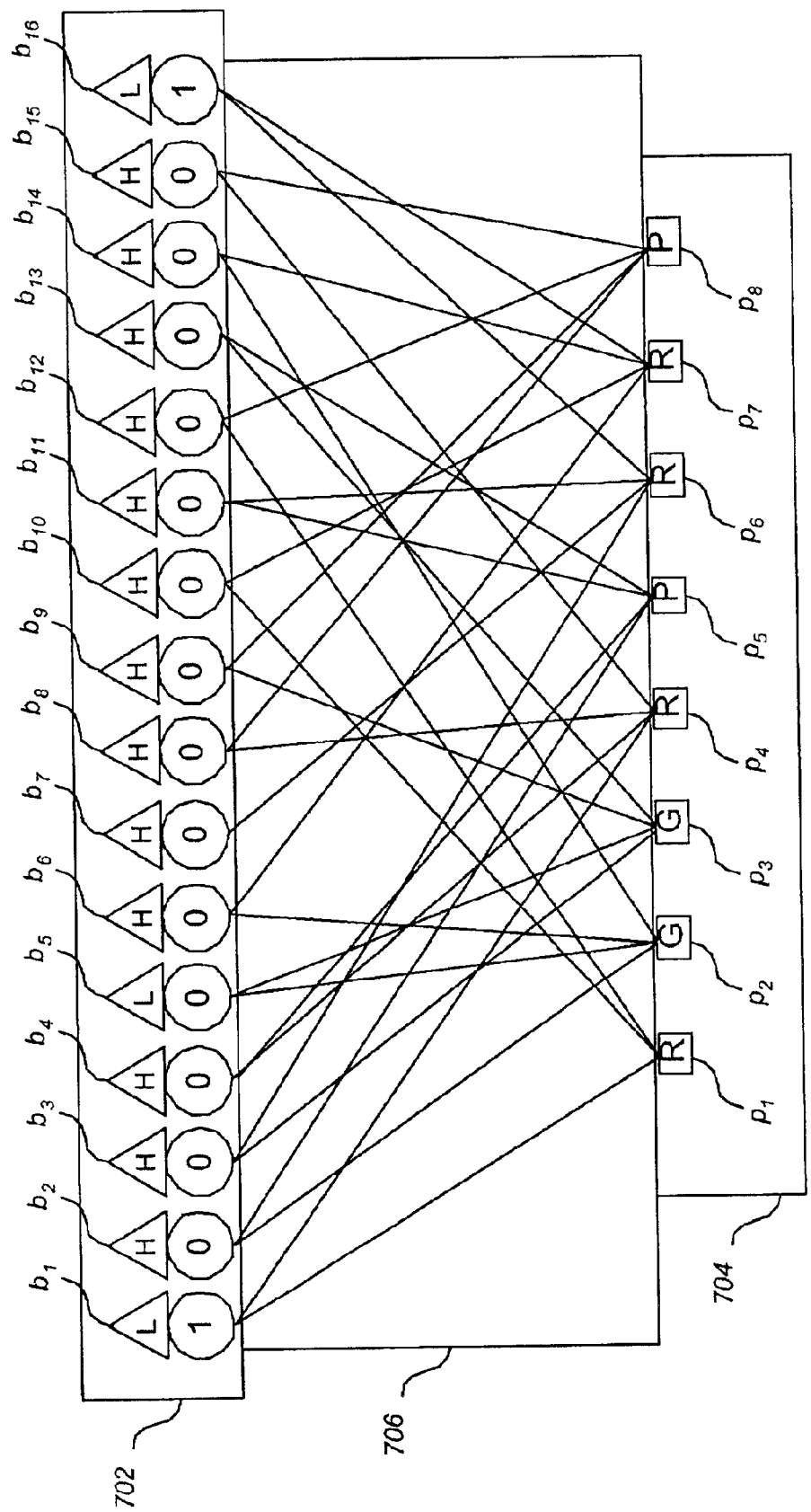
FIGS. 7–11 show an example operation of an implementation in correcting a double error.

An example operation of an implementation in correcting a double error is discussed with reference to FIGS. 7–11. Referring to FIG. 7, a register 702 is connected to a parity checker 704 by connections 706. Register 702 contains a 16-bit word, which can be a result vector or some other vector in the process of being corrected to produce a codeword. For each bit of the codeword, register 702 contains a value (shown in a circle) and a confidence measure (shown in a triangle). The confidence values can be obtained by the methods described above. Each confidence value can be low (L), medium (M), or high (H).

In this example, the transmitted codeword (0000 0000 0000 0000) has been corrupted such that the codeword presented in register 702 (1000 0000 0000 0001) contains errors in bits $b_1$ and $b_{16}$. Bits $b_1$, $b_5$, and $b_{16}$ of the word have low confidence values indicating that value of those bits is likely incorrect, while the rest of the bits have high confidence values indicating that value of those bits is likely correct.

Each bit is connected to one or more bit checkers p, each of which produces one of three parity values based on the bit values and confidence values of the bits to which it is connected. A value of R indicates that the parity check performed by that bit checker has failed. A value of G indicates that the parity check for that bit checker has been satisfied, but that there is a low level of confidence in the parity check because one or more of the bits checked has a low confidence measure. A value of P indicates that the parity check for that bit checker has been satisfied, and that there is a high level of confidence in the parity check because all of the bits checked have a high confidence measure.

Because the bits in error are $b_1$ and $b_{16}$, the parity checks fail for the bit checkers ($p_1$, $p_4$, $p_6$ and $p_7$) connected to bits $b_1$ and $b_{16}$. Therefore bit checkers $p_1$, $p_4$, $p_6$ and $p_7$ each produce a value of R. The parity checks succeed for bit checkers $p_2$ and $p_3$. However, each of bit checkers $p_2$ and $p_3$ is connected to a bit with a low confidence measure (bit b5). Therefore each of bit checkers $p_2$ and $p_3$ produces a value of G. The parity checks also succeed for bit checkers $p_5$ and $P_8$. Further, neither of bit checkers $p_5$ and $P_8$ is connected to a bit with a low confidence measure. Therefore each of bit checkers $p_5$ and $P_8$ produces a value of P.

Figure 8:
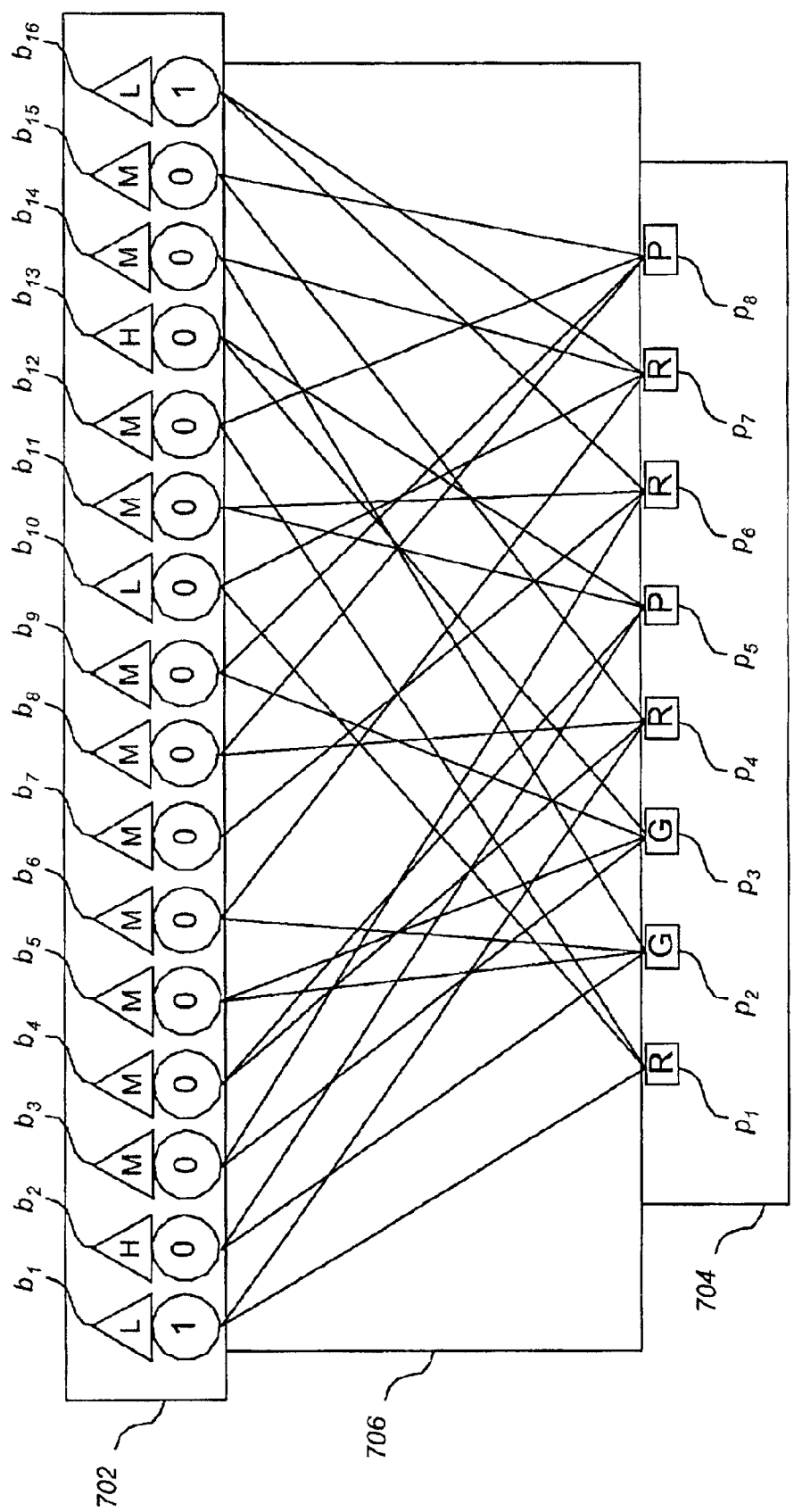

Next, register 702 changes the confidence values of the bits based on the values of the bit checkers. The results are shown in FIG. 8. The confidence values are now low for bits $b_1$, $b_{10}$, and $b_{16}$, high for bits $b_2$ and $b_{13}$, and medium for the remaining bits.

Figure 9:
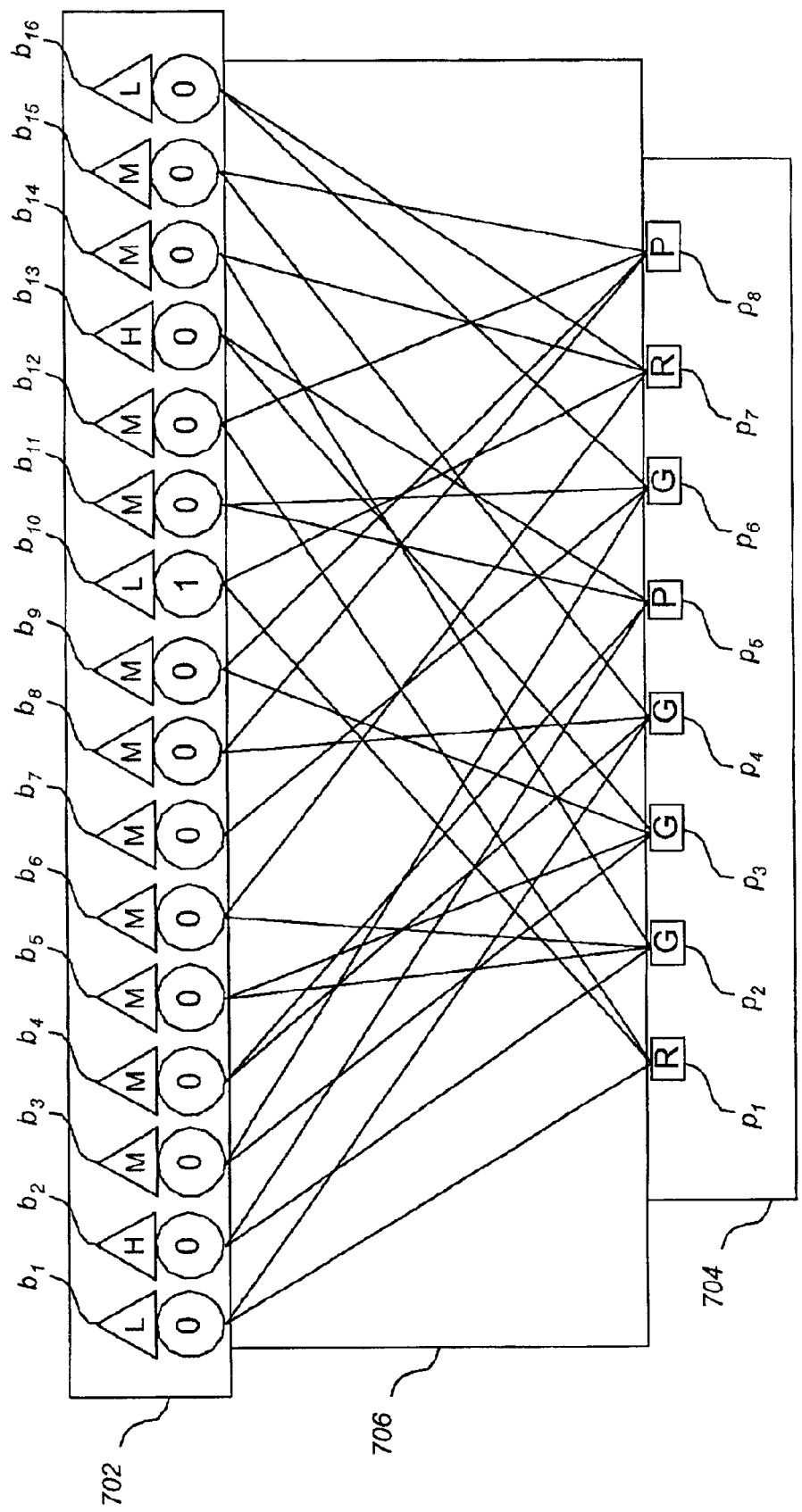

Next, register 702 changes the values of the bits based on the confidence values, as shown in FIG. 9. In this example, the value of a bit is changed only when its confidence value is low. Therefore, register 702 changes the values of bits $b_1$, $b_{10}$, and $b_{16}$. Next, parity checker 704 performs a parity check on the updated bits, and modifies the values of the parity checks accordingly, as shown in FIG. 9.

Figure 10:
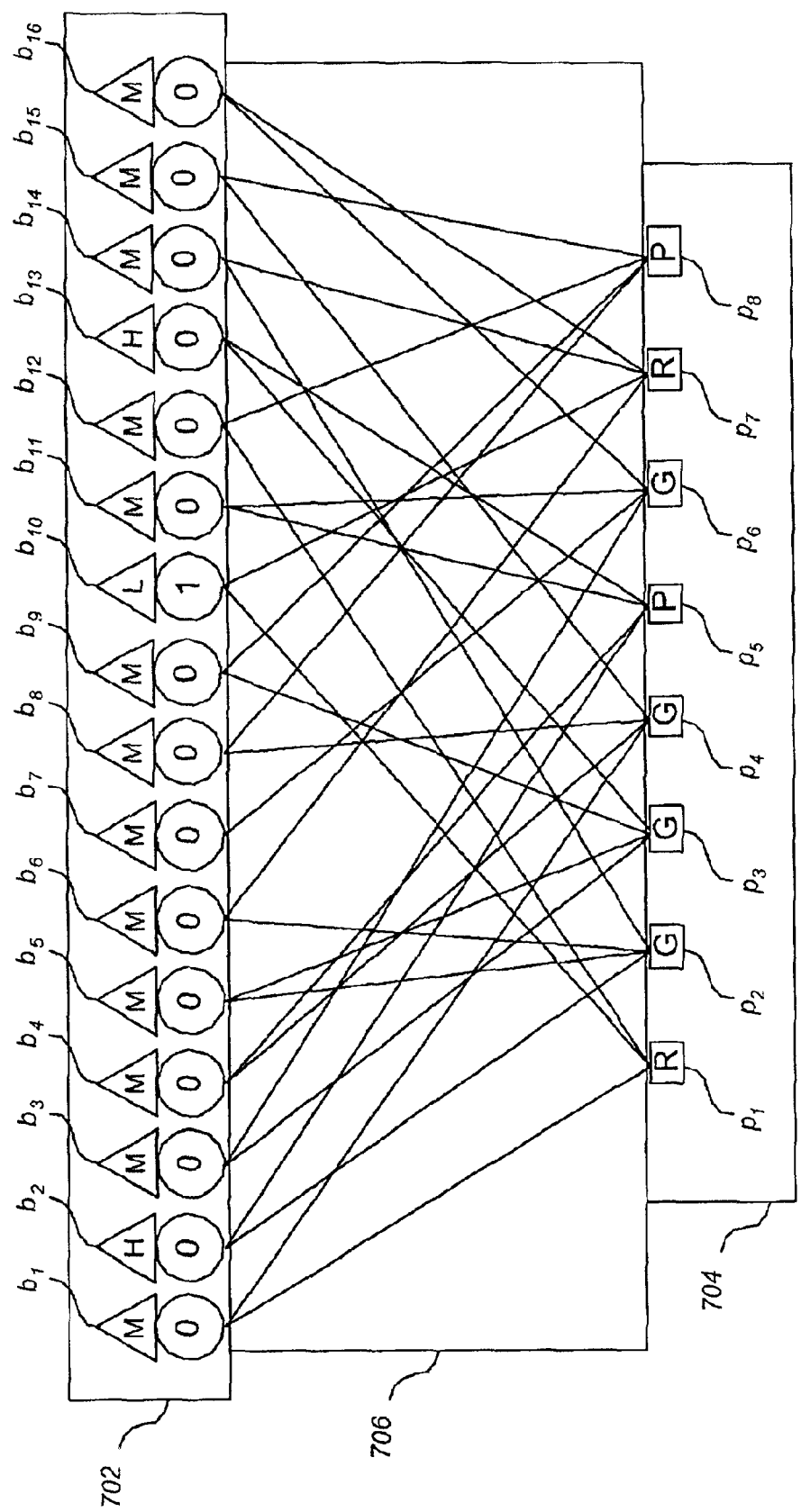
Figure 11:
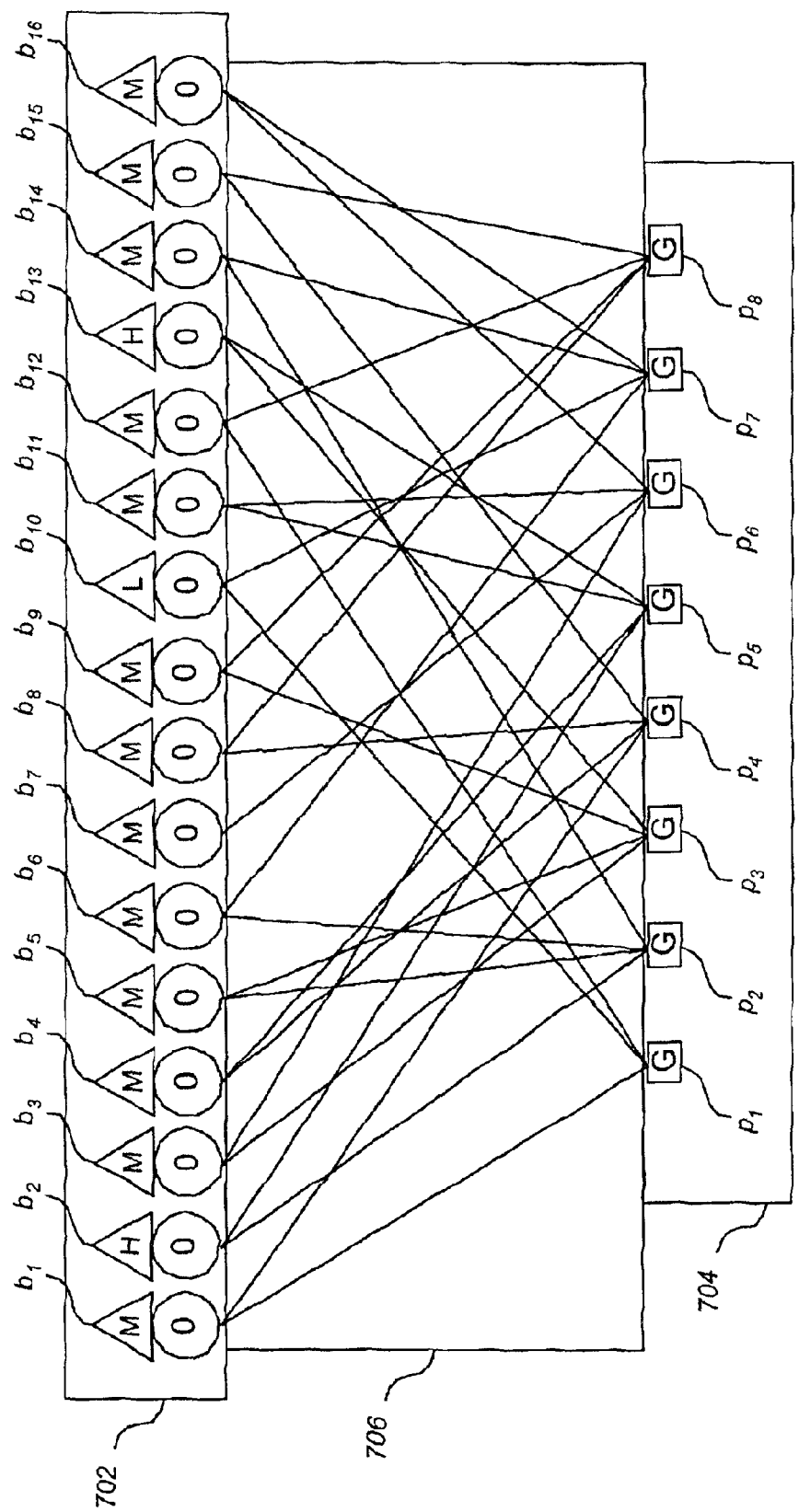

Next, register 702 updates the confidence measures for the bits based on the parity checks. The confidence values for bits $b_1$ and $b_{16}$ is changed to medium, as shown in FIG. 10. Next, register 702 changes the bit values for bits having low confidence values. Only bit b10 has a low confidence value, so its bit value is changed, as shown in FIG. 1. Finally, parity checker 704 performs a parity check on the updated bits, and modifies the values of the parity checks accordingly. Now all of the parity checks are satisfied, as shown in FIG. 11, and the original codeword has been recovered.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of embodiments of the invention have been described. Nevertheless, it will be understood that various modifications may be made without departing from the spirit and scope of the invention. Accordingly, other embodiments are within the scope of the following claims.

What is claimed is:

1. A method for correcting errors introduced into a set of data bits during transmission of the set of data bits over a channel, comprising:

determining a confidence measure for each data bit based only on the values of one or more of the data bits, each confidence measure representing the probability that the value of the corresponding data bit is correct; and changing the value of a given data bit when the confidence measure for the given data bit indicates that the value of the given data bit is not correct, thereby producing a corrected data bit.

2. The method of claim 1, further comprising:

determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

3. The method of claim 2, wherein determining a second confidence measure for each corrected data bit comprises:

generating a plurality of second check bits based on the corrected data bits such that each of the second check bits is a predetermined function of one or more bits of the corrected data; and determining the second confidence measures based on the values of the second check bits and the confidence measures.

4. The method of claim 1, wherein determining a confidence measure for each data bit comprises:

generating a plurality of check bits based on the data bits such that each of the check bits is a predetermined function of one or more of the data bits; and determining the confidence measures based on the values of the check bits.

5. The method of claim 4, wherein generating comprises:

taking the logical exclusive-or of a predetermined subset of the data bits, thereby producing a predetermined one of the check bits.

6. The method of claim 1, further comprising:

determining a composite confidence measure based on the confidence measures; and executing the changing step only when the composite confidence measure falls below a predetermined composite confidence threshold.

7. The method of claim 1, wherein the data bits are encoded before transmission over the channel using a majority-logic-decodable code.

8. The method of claim 1, wherein the channel is a fiber-optic channel.

9. The method of claim 1, wherein the channel is an optical storage medium.

10. The method of claim 9, wherein the optical storage medium is a digital video disc (DVD).

11. The method of claim 9, wherein the optical storage medium is a compact disc (CD).

12. A method for correcting errors introduced into a set of data bits during transmission of the set of data bits over a channel, comprising:

determining a confidence measure for each data bit based on the received energy level of that data bit, each confidence measure representing the probability that the value of the corresponding data bit has a predetermined value;

selecting a value for each data bit based on the corresponding confidence measure, thereby producing corrected data bits;

determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

13. The method of claim 12, wherein determining a confidence measure for each data bit comprises:

generating a plurality of check bits based on the data bits such that each of the check bits is a predetermined function of one or more of the data bits; and determining the confidence measures based on the values of the check bits.

14. The method of claim 13, wherein generating comprises:

taking the logical exclusive-or of a predetermined subset of the data bits, thereby producing a predetermined one of the check bits.

15. The method of claim 12, wherein determining a second confidence measure for each corrected data bit comprises:

generating a plurality of second check bits based on the corrected data bits such that each of the second check bits is a predetermined function of one or more bits of the corrected data; and determining the second confidence measures based on the values of the second check bits and the confidence measures.

16. The method of claim 12, further comprising:

determining a composite confidence measure based on the confidence measures; and executing the changing step only when the composite confidence measure falls below a predetermined composite confidence threshold.

17. The method of claim 12, wherein the channel is a fiber-optic channel.

18. The method of claim 12, wherein the channel is an optical storage medium.

19. The method of claim 18, wherein the optical storage medium is a digital video disc (DVD).

20. The method of claim 18, wherein the optical storage medium is a compact disc (CD).

21. Computer-readable media embodying instructions executable by a computer to perform a method for correcting errors introduced into a set of data bits during transmission of the set of data bits over a channel, the method comprising:

determining a confidence measure for each data bit based only on the values of one or more of the data bits, each confidence measure representing the probability that the value of the corresponding data bit is correct; and changing the value of a given data bit when the confidence measure for the given data bit indicates that the value of the given data bit is not correct, thereby producing a corrected data bit.

22. The media of claim 21, wherein the method further comprises:

determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

23. The media of claim 22, wherein determining a second confidence measure for each corrected data bit comprises:

generating a plurality of second check bits based on the corrected data bits such that each of the second check bits is a predetermined function of one or more bits of the corrected data; and determining the second confidence measures based on the values of the second check bits and the confidence measures.

24. The media of claim 21, wherein determining a confidence measure for each data bit comprises:

generating a plurality of check bits based on the data bits such that each of the check bits is a predetermined function of one or more of the data bits; and determining the confidence measures based on the values of the check bits.

25. The media of claim 24, wherein generating comprises:

taking the logical exclusive-or of a predetermined subset of the data bits, thereby producing a predetermined one of the check bits.

26. The media of claim 21, wherein the method further comprises:

determining a composite confidence measure based on the confidence measures; and executing the changing step only when the composite confidence measure falls below a predetermined composite confidence threshold.

27. The media of claim 21, wherein the data bits are encoded before transmission over the channel using a majority-logic-decodable code.

28. The media of claim 21, wherein the channel is a fiber-optic channel.

29. The media of claim 21, wherein the channel is an optical storage medium.

30. The media of claim 29, wherein the optical storage device medium is a digital video disc (DVD).

31. The media of claim 29, wherein the optical storage device medium is a compact disc (CD).

32. Computer-readable media embodying instructions executable by a computer to perform a method for correcting errors introduced into a set of data bits during transmission of the set of data bits over a channel, the method comprising:

determining a confidence measure for each data bit based on the received energy level of that data bit, each confidence measure representing the probability that the value of the corresponding data bit has a predetermined value;

selecting a value for each data bit based on the corresponding confidence measure, thereby producing corrected data bits;

determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and changing the value of a given corrected data bit when the second confidence measure for the given corrected data bit indicates that the value of the given corrected data bit is not correct, thereby producing twice-corrected data bits.

33. The media of claim 32, wherein determining a confidence measure for each data bit comprises:
generating a plurality of check bits based on the data bits such that each of the check bits is a predetermined function of one or more of the data bits; and
determining the confidence measures based on the values of the check bits.

34. The media of claim 33, wherein generating comprises:
taking the logical exclusive-or of a predetermined subset of the data bits, thereby producing a predetermined one of the check bits.

35. The media of claim 32, wherein determining a second confidence measure for each corrected data bit comprises:
generating a plurality of second check bits based on the corrected data bits such that each of the second check bits is a predetermined function of one or more bits of the corrected data; and
determining the second confidence measures based on the values of the second check bits and the confidence measures.

36. The media of claim 32, wherein the method further comprises:
determining a composite confidence measure based on the confidence measures; and
executing the changing step only when the composite confidence measure falls below a predetermined composite confidence threshold.

37. The media of claim 32, wherein the channel is a fiber-optic channel.

38. The media of claim 32, wherein the channel is an optical storage medium.

39. The media of claim 38, wherein the optical storage device medium is a digital video disc (DVD).

40. The media of claim 38, wherein the optical storage device medium is a compact disc (CD).

41. An apparatus for correcting errors introduced into a set of data bits during transmission of the set of data bits over a channel, comprising:
means for determining a confidence measure for each data bit based only on the values of one or more of the data bits, each confidence measure representing the probability that the value of the corresponding data bit is correct; and
means for changing the value of a given data bit when the confidence measure for the given data bit indicates that the value of the given data bit is not correct, thereby producing a corrected data bit.

42. The apparatus of claim 41, further comprising:
means for determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and
means for changing the value of a given corrected data bit when the second confidence measure for the given corrected data bit indicates that the value of the given corrected data bit is not correct, thereby producing twice-corrected data bits.

43. The apparatus of claim 42, wherein means for determining a second confidence measure for each corrected data bit comprises:
means for generating a plurality of second check bits based on the corrected data bits such that each of the second check bits is a predetermined function of one or more bits of the corrected data; and
means for determining the second confidence measures based on the values of the second check bits and the confidence measures.

44. The apparatus of claim 41, wherein means for determining a confidence measure for each data bit comprises:
means for generating a plurality of check bits based on the data bits such that each of the check bits is a predetermined function of one or more of the data bits; and
means for determining the confidence measures based on the values of the check bits.

45. The apparatus of claim 44, wherein means for generating comprises:
means for taking the logical exclusive-or of a predetermined subset of the data bits, thereby producing a predetermined one of the check bits.

46. The apparatus of claim 41, further comprising:
means for determining a composite confidence measure based on the confidence measures; and
means for executing the changing step only when the composite confidence measure falls below a predetermined composite confidence threshold.

47. The apparatus of claim 41, wherein the data bits are encoded before transmission over the channel using a majority-logic-decodable code.

48. The apparatus of claim 41, wherein the channel is a fiber-optic channel.

49. The apparatus of claim 41, wherein the channel is an optical storage medium.

50. The apparatus of claim 49, where in the optical storage device medium is a digital video disc (DVD).

51. The apparatus of claim 49, wherein the optical storage device medium is a compact disc (CD).

52. An apparatus for correcting errors introduced into a set of data bits during transmission of the set of data bits over a channel, comprising:
means for determining a confidence measure for each data bit based on the received energy level of that data bit, each confidence measure representing the probability that the value of the corresponding data bit has a predetermined value;
means for selecting a value for each data bit based on the corresponding confidence measure, thereby producing corrected data bits;
means for determining a second confidence measure for each corrected data bit based on the confidence measure for the data bit corresponding to that corrected data bit and the values of one or more of the corrected data bits, each second confidence measure representing the probability that the value of the corresponding corrected data bit is correct; and
means for changing the value of a given corrected data bit when the second confidence measure for the given corrected data bit indicates that the value of the given corrected data bit is not correct, thereby producing twice-corrected data bits.

53. The apparatus of claim 52, wherein means for determining a confidence measure for each data bit comprises:
means for generating a plurality of check bits based on the data bits such that each of the check bits is a predetermined function of one or more of the data bits; and means for determining the confidence measures based on the values of the check bits.

54. The apparatus of claim 53, wherein means for generating comprises:

means for taking the logical exclusive-or of a predetermined subset of the data bits, thereby producing a predetermined one of the check bits.

55. The apparatus of claim 52, wherein means for determining a second confidence measure for each corrected data bit comprises:

means for generating a plurality of second check bits based on the corrected data bits such that each of the second check bits is a predetermined function of one or more bits of the corrected data; and means for determining the second confidence measures based on the values of the second check bits and the confidence measures.

56. The apparatus of claim 52, further comprising:

means for determining a composite confidence measure based on the confidence measures; and means for executing the changing step only when the composite confidence measure falls below a predetermined composite confidence threshold.

57. The apparatus of claim 52, wherein the channel is a fiber-optic channel.

58. The apparatus of claim 52, wherein the channel is an optical storage medium.

59. The apparatus of claim 58, wherein the optical storage device medium is a compact disc (CD).

60. The apparatus of claim 58, wherein the optical storage device medium is a digital video disc (DVD).

61. An apparatus for correcting errors introduced into a set of data bits during transmission of the set of data bits over a channel, comprising:

a checker to determine a confidence measure for each data bit based only on the values of one or more of the data bits, each confidence measure representing the probability that the value of the corresponding data bit is correct; and a corrector to change the value of a given data bit when the confidence measure for the given data bit indicates that the value of the given data bit is not correct, thereby producing a corrected data bit.

62. The apparatus of claim 61, further comprising:

a second checker to determine a second confidence measure for each corrected data bit based on the confidence measure for the data bit corresponding to that corrected data bit and the values of one or more of the corrected data bits, each second confidence measure representing the probability that the value of the corresponding corrected data bit is correct; and a second corrector to change the value of a given corrected data bit when the second confidence measure for the given corrected data bit indicates that the value of the given corrected data bit is not correct, thereby producing twice-corrected data bits.

63. The apparatus of claim 62, wherein the second checker:

generates a plurality of second check bits based on the corrected data bits such that each of the second check bits is a predetermined function of one or more bits of the corrected data; and determines the second confidence measures based on the values of the second check bits and the confidence measures.

64. The apparatus of claim 61, wherein the checker:

generates a plurality of check bits based on the data bits such that each of the check bits is a predetermined function of one or more of the data bits; and determines the confidence measures based on the values of the check bits.

65. The apparatus of claim 64, wherein the checker further takes the logical exclusive-or of a predetermined subset of the data bits, thereby producing a predetermined one of the check bits.

66. The apparatus of claim 61, wherein the corrector:

determines a composite confidence measure based on the confidence measures; and changes the value of a given data bit only when the composite confidence measure falls below a predetermined composite confidence threshold.

67. The apparatus of claim 61, wherein the data bits are encoded before transmission over the channel using a majority-logic-decodable code.

68. The apparatus of claim 61, wherein the channel is a fiber-optic channel.

69. The apparatus of claim 61, wherein the channel is an optical storage medium.

70. The apparatus of claim 69, wherein the optical storage device medium is a digital video disc (DVD).

71. The apparatus of claim 69, wherein the optical storage device medium is a compact disc (CD).

72. An apparatus for correcting errors introduced into a set of data bits during transmission of the set of data bits over a channel comprising:

a first checker to determine a confidence measure for each data bit based on the received energy level of that data bit, each confidence measure representing the probability that the value of the corresponding data bit has a predetermined value;

a first corrector to select a value for each data bit based on the corresponding confidence measure, thereby producing corrected data bits;

a second checker to determine a second confidence measure for each corrected data bit based on the confidence measure for the data bit corresponding to that corrected data bit and the values of one or more of the corrected data bits, each second confidence measure representing the probability that the value of the corresponding corrected data bit is correct; and a second corrector to change the value of a given corrected data bit when the second confidence measure for the given corrected data bit indicates that the value of the given corrected data bit is not correct, thereby producing twice-corrected data bits.

73. The apparatus of claim 72, wherein the first checker:

generates a plurality of check bits based on the data bits such that each of the check bits is a predetermined function of one or more of the data bits; and determines the confidence measures based on the values of the check bits.

74. The apparatus of claim 73, wherein the first checker further takes the logical exclusive-or of a predetermined subset of the data bits, thereby producing a predetermined one of the check bits.

75. The apparatus of claim 72, wherein the second checker:

generates a plurality of second check bits based on the corrected data bits such that each of the second check bits is a predetermined function of one or more bits of the corrected data; and determines the second confidence measures based on the values of the second check bits and the confidence measures.

76. The apparatus of claim 72, wherein the first corrector:

determines a composite confidence measure based on the confidence measures; and changes the value of a given data bit only when the composite confidence measure falls below a predetermined composite confidence threshold.

77. The apparatus of claim 72, wherein the channel is a fiber-optic channel.

78. The apparatus of claim 72, wherein the channel is an optical storage medium.

79. The apparatus of claim 78, wherein the optical storage device medium is a digital video disc (DVD).

80. The apparatus of claim 78, wherein the optical storage device medium is a compact disc (CD).

* * * * *